(12) United States Patent
Pei

(10) Patent No.: US 8,013,358 B2
(45) Date of Patent: Sep. 6, 2011

(54) LIGHT EMITTING DIODE

(75) Inventor: Chien-Chang Pei, Taipei County (TW)

(73) Assignee: Everlight Electronics Co., Ltd., Taipei (TW)

(*) Notice: Subject to any disclaimer, the term of this patent is extended or adjusted under 35 U.S.C. 154(b) by 127 days.

(21) Appl. No.: 12/606,051

(22) Filed: Oct. 26, 2009

(65) Prior Publication Data

US 2011/0031524 A1    Feb. 10, 2011

(30) Foreign Application Priority Data

Aug. 6, 2009   (TW) .............................. 98126500 A

(51) Int. Cl.
*H01L 33/00*   (2010.01)
(52) U.S. Cl. ............ 257/99; 257/E33.062; 257/E33.075
(58) Field of Classification Search .................... 257/99, 257/E33.062, E33.075
See application file for complete search history.

(56) References Cited

U.S. PATENT DOCUMENTS 7,445,354 B2 * 11/2008 Aoki et al. .................... 362/241
2004/0027067 A1   2/2004 Song et al.

FOREIGN PATENT DOCUMENTS

JP          2007-234846        9/2007

* cited by examiner

*Primary Examiner* — Mark Prenty

(57) ABSTRACT

The invention provides a light emitting diode. The light emitting diode includes a ceramic substrate having a first surface and an opposite second surface. A first conductive trace metal layer and a second conductive trace metal layer are disposed on the first surface of the ceramic substrate. At least one light emitting diode chip is disposed on the first surface of the ceramic substrate, respectively and electrically connected to the first and second conductive trace metal layers. A plurality of thermal metal pads is disposed on the second surface of the ceramic substrate, wherein the thermal metal pads are electrically isolated from the light emitting diode chip.

15 Claims, 5 Drawing Sheets

LIGHT EMITTING DIODE

CROSS REFERENCE TO RELATED APPLICATIONS

This application claims the benefit of Taiwan Application No. 98126500, filed on Aug. 6, 2009, the entirety of which is incorporated by reference herein.

BACKGROUND OF THE INVENTION

1. Field of the Invention

The present invention relates to a light emitting diode, and in particular, to a light emitting diode having a plurality of thermal metal pads.

2. Description of the Related Art

Light emitting diodes (LEDs) are solid-state light sources having advantages of having low power consumption, a small size, fast operating speeds, long lifespans, less attenuation, solid appearance, good shock resistance, and a simple fabrication process, thereby promoting LED use instead of traditional light sources. However, for LEDs applied as backlights and electrical illuminations, a heat dissipation problem still exists. To solve the heat dissipation problem, a thermal metal pad disposed on a ceramic substrate of the conventional LEDs is design as a single structure with a large area. When the conventional single thermal metal pad bonds to a circuit substrate below the conventional LEDs by soldering, however, the uneven surface of the ceramic substrate results in non uniform cohesion of the solders, thereby forming gas hole residue and cracks at an interface between the conventional single thermal metal pad and the circuit substrate. Therefore, the interface between the conventional single thermal metal pad and the circuit substrate has poor bonding. Also, when the conventional LEDs are operated, generated heat stress results in a continuous glowing crack along gas holes due to the large area of the conventional single thermal metal pad. Therefore, LEDs may detach from the circuit substrate at the interface therebetween, thereby reducing electrical performance, heat dissipation area, heat dissipating efficiency and reliability.

Thus, a novel light emitting diode with high heat dissipating efficiency and reliability is desired.

BRIEF SUMMARY OF INVENTION

A light emitting diode is provided. An exemplary embodiment of a light emitting diode has a plurality of the thermal metal pads with small areas. Each solder can firmly adhere to corresponding thermal metal pads. Therefore, reducing a gas hole generation problem. If a crack occurs in one of the thermal metal pads due to a poor bonding interface, the generated crack is limited to the same thermal metal pad and does not affect adjacent thermal metal pads. If one of the thermal metal pads detaches from the circuit substrate at an interface therebetween, the bonding between adjacent thermal metal pads and the circuit substrate will not be affected. Therefore, electrical performance and reliability of the light emitting diode is maintained, thereby maintaining heat dissipating efficiency thereof.

An exemplary embodiment of a light emitting diode comprises: a ceramic substrate having a first surface and an opposite second surface; a first conductive trace metal layer and a second conductive trace metal layer disposed on the first surface of the ceramic substrate; at least one light emitting diode chip disposed on the first surface of the ceramic substrate, respectively and electrically connected to the first and second conductive trace metal layers; and a plurality of thermal metal pads disposed on the second surface of the ceramic substrate, wherein the thermal metal pads are electrically isolated from the light emitting diode chip.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1A:
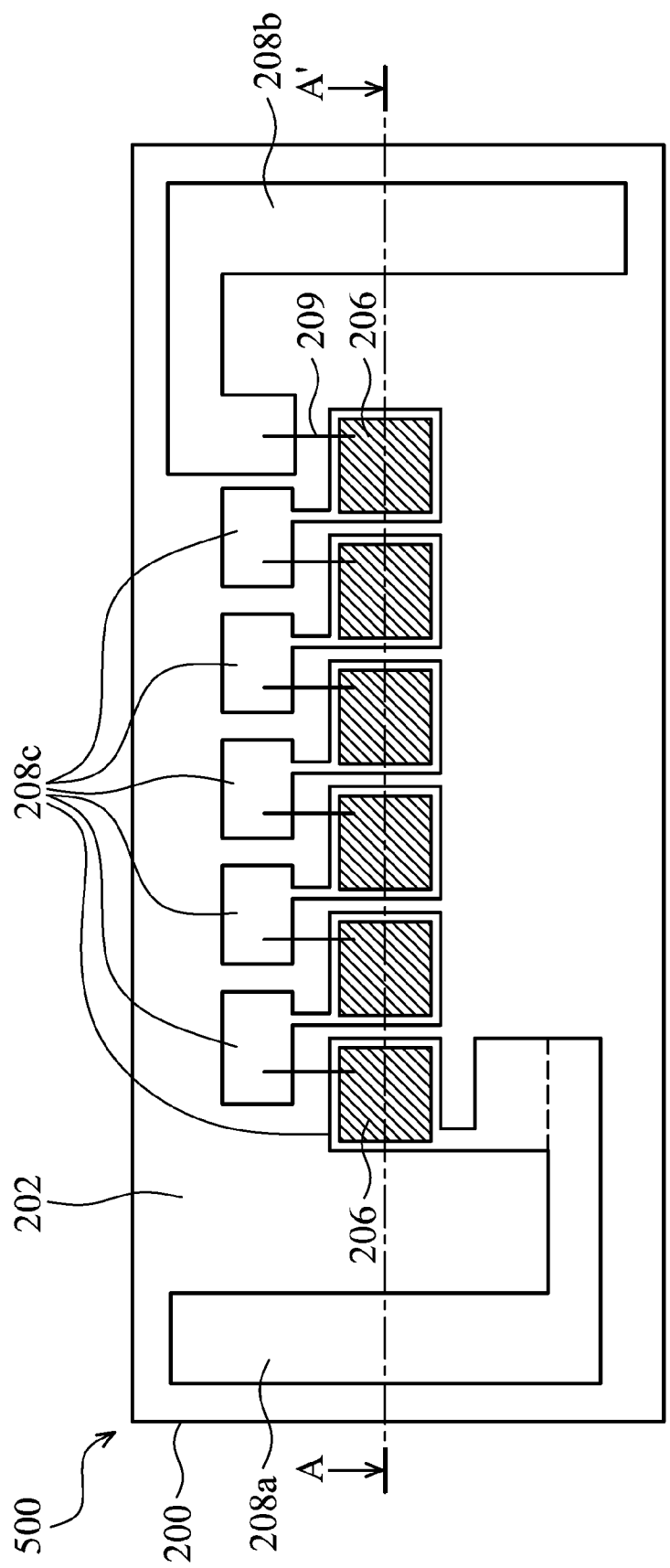
FIG. 1a is a top view showing one exemplary embodiment of a light emitting diode of the invention.

The following description is of a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

Figure 1B:
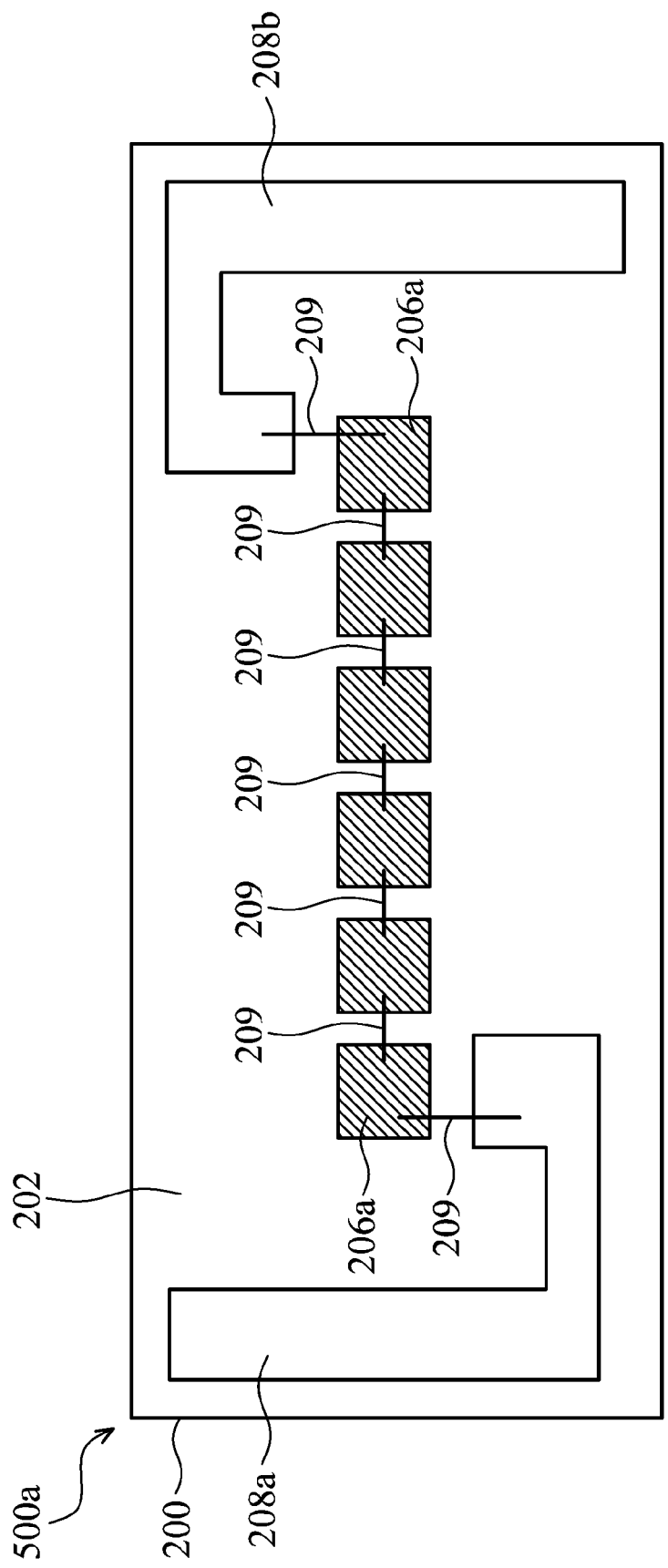
FIGS. 1b and 1c are top views of other exemplary embodiments of a light emitting diode of the invention showing various electrical connections of the light emitting chip.
Figure 1C:
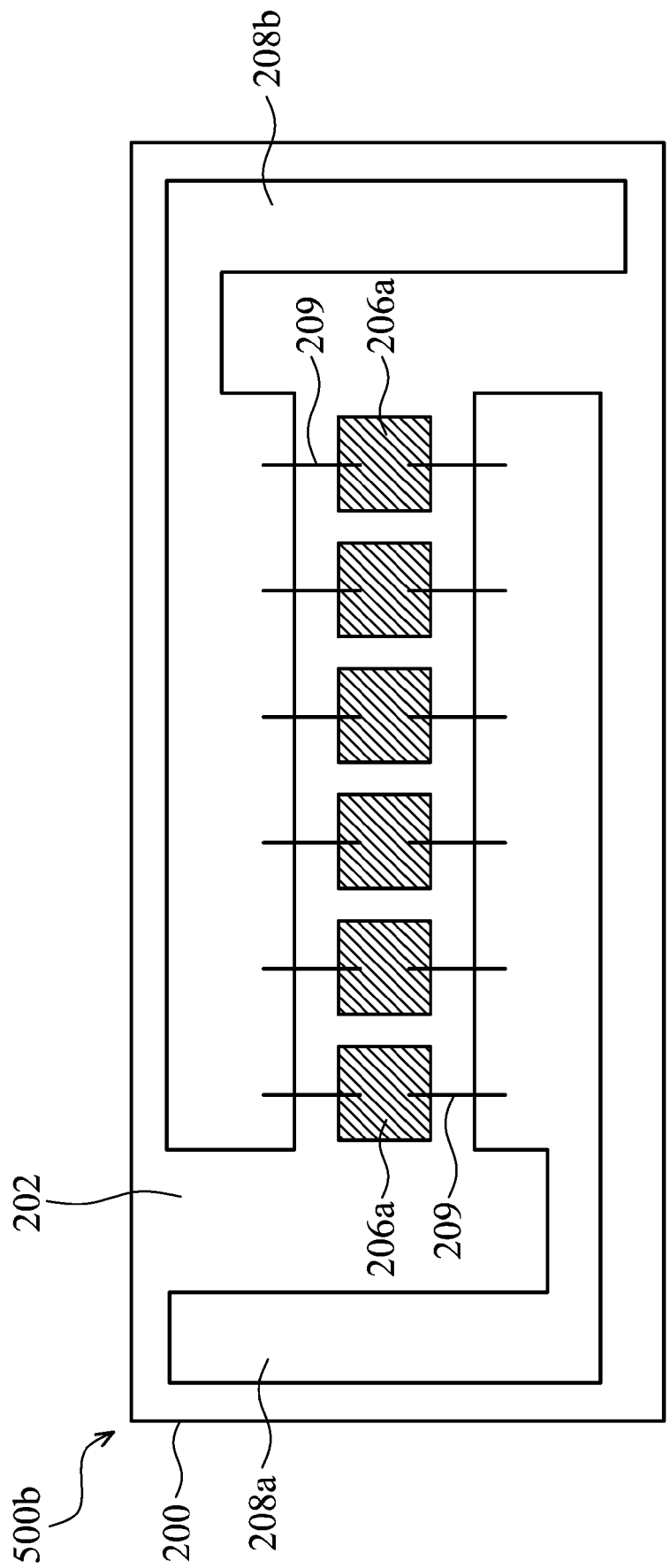
Figure 1D:
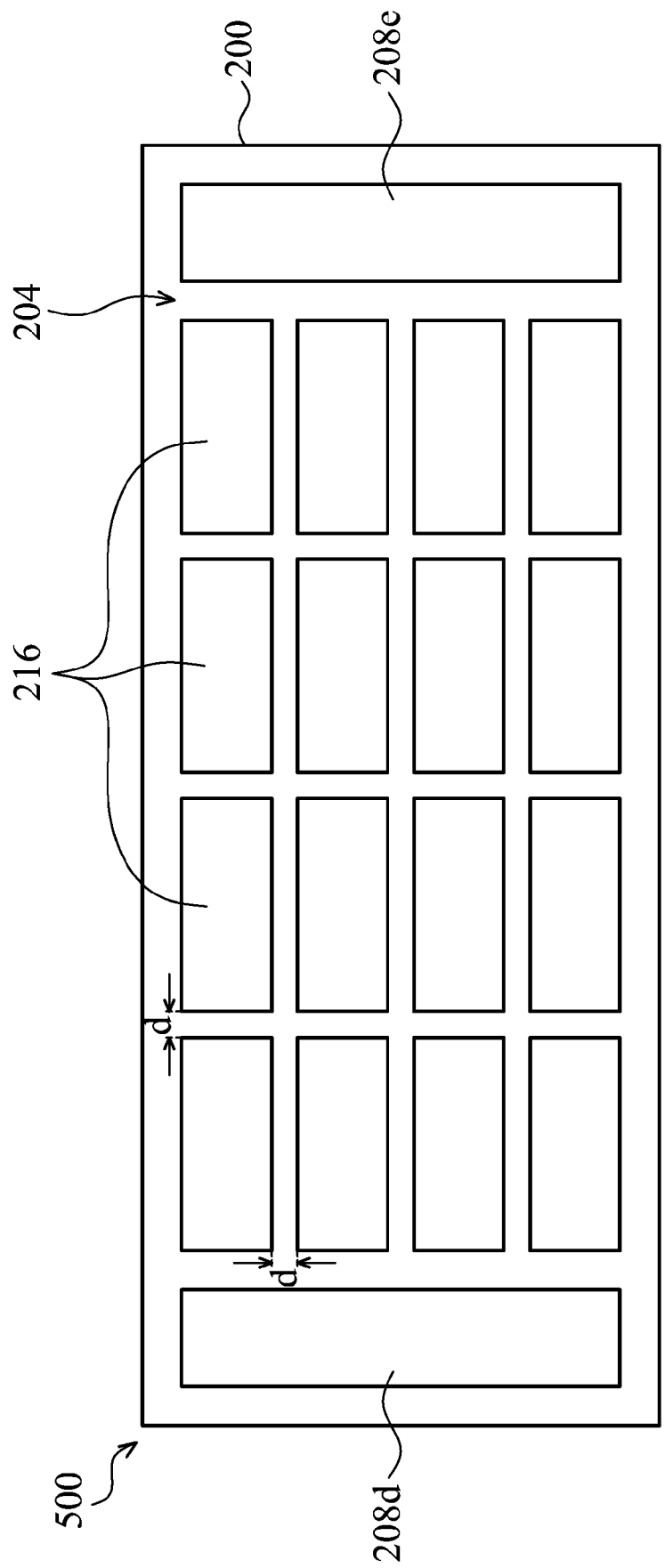
FIG. 1d is a bottom view showing one exemplary embodiment of a light emitting diode of the invention.
Figure 1E:
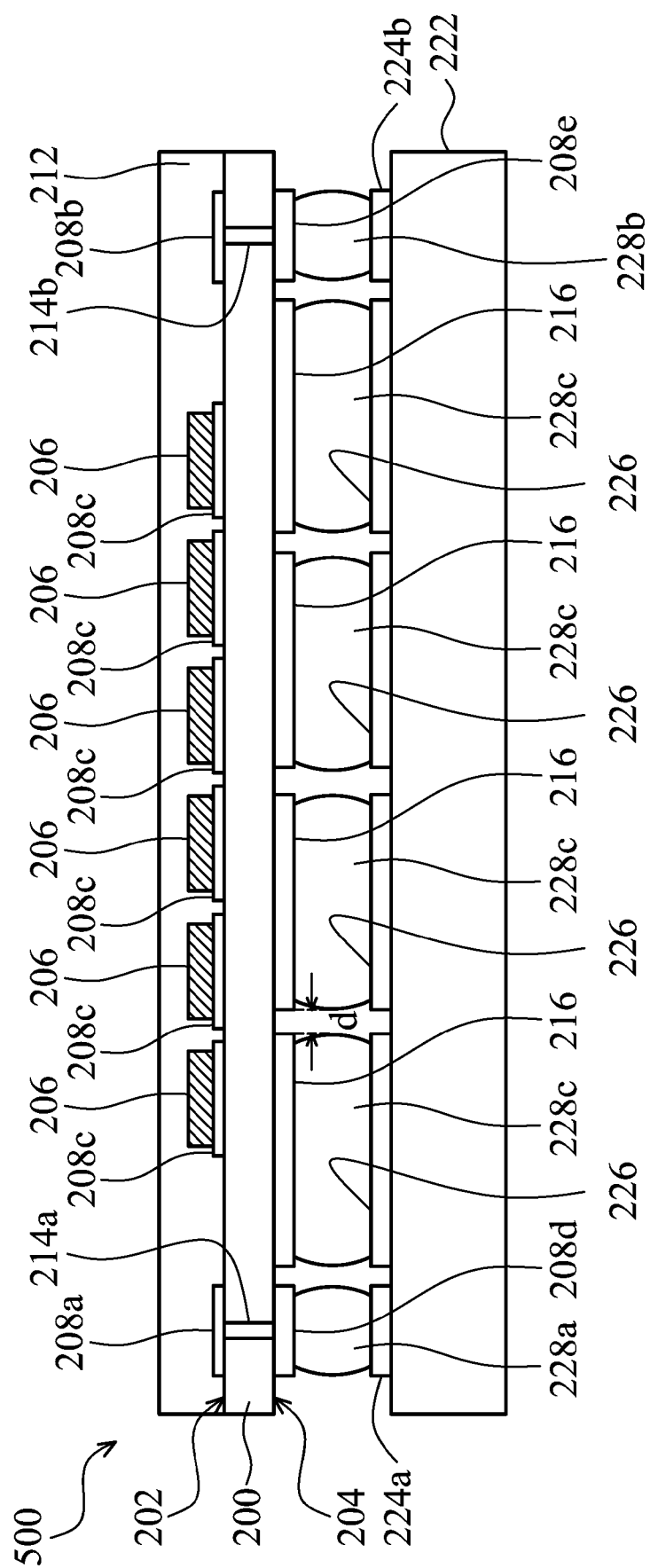
FIG. 1e is cross section view taken along line A-A' of FIG. 1a showing one exemplary embodiment of a light emitting device connected to a circuit substrate.

FIG. 1a is a top view showing one exemplary embodiment of a light emitting diode 500 of the invention. To describe disposition of light emitting diode chips 206 and the conductive trace structure, a packaging adhesive 212 of the light emitting diode 500 as shown in FIG. 1e is not illustrated herein for brevity. FIGS. 1b and 1c are top views of exemplary embodiments of light emitting diodes 500a and 500b of the invention showing various electrical connections of light emitting chips 206a. FIG. 1d is a bottom view showing one exemplary embodiment of a light emitting diode 500 of the invention. FIG. 1d also illustrates a bottom view showing one exemplary embodiment of a light emitting diode 500a or 500b. FIG. 1e is cross section view taken along line A-A' of FIG. 1a showing one exemplary embodiment of a light emitting device 500 connected to a circuit substrate 222. As shown in FIGS. 1a to 1d, one exemplary embodiment of a light emitting device 500 may comprise a ceramic substrate 200, a plurality of light emitting diode chips 206, a conductive trace structure and a plurality of thermal metal pads 216. In one embodiment, the ceramic substrate 200 has a first surface 202 and a second surface 204 opposite to the first surface 202. In one embodiment, the ceramic substrate 200 may comprise aluminum nitride (AlN) or aluminum oxide ($Al_2O_3$). A plurality of light emitting diode chips 206 is disposed on the first surface 202 of the ceramic substrate 200. In one embodiment as shown in FIG. 1a, the light emitting diode chip 206 has a p-type electrode and an n-type electrode (not shown) respectively on a top surface and a bottom surface of the light emitting diode chip 206. Note that the disposition of the p-type and n-type electrodes may be switched according to design of the light emitting diode chip 206. As shown in FIGS. 1a, 1d and 1e, the conductive trace structure may comprise a first conductive trace metal layer 208a and a second conductive trace metal layer 208b directly disposed on the first surface 202 of the ceramic substrate 200, a third conductive trace metal layer 208c disposed between the ceramic substrate 200 and the light emitting diode chips 206 electrically connecting to the light emitting diode chips 206, conductive traces 209 electrically connected between the light emitting diode chips 206 and the second conductive trace metal layer 208b or third conductive trace metal layer 208c, and fourth and fifth conductive trace metal layers 208d and 208e disposed on the second surface 204 of the ceramic substrate 200. In one embodiment, the conductive trace structure may be used as an electrical connection path for input/output (I/O) signals, ground signals, and power signals of the light emitting diode chips 206. Additionally, as shown in FIG. 1d, in one embodiment, the first conductive trace metal layer 208a of the conductive trace structure may be electrically connected to the fourth conductive trace metal layer 208d disposed on the second surface 204 of the ceramic substrate 200 by a via 214a formed through the ceramic substrate 200. Similarly, the second conductive trace metal layer 208b of the conductive trace structure may be electrically connected to the fifth conductive trace metal layer 208e disposed on the second surface 204 of the ceramic substrate 200 by a via 214b formed through the ceramic substrate 200. Therefore, as shown in FIG. 1e, the conductive trace structure may extend on the second surface 204 of the ceramic substrate 200, thereby being electrically connected to the circuit substrate 222, which connects to the second surface 204 of the ceramic substrate 200. In one embodiment, the conductive trace structure may comprise Ag, Cu, Ni, Al or combinations thereof. As shown in FIG. 1e, one exemplary embodiment of the light emitting device 500 further comprises a packaging adhesive 212 encapsulating the first surface 202 of the ceramic substrate 200, the light emitting diode chips 206, the first conductive trace metal layer 208a, the second conductive trace metal layer 208b, the third conductive trace metal layer 208c and the conductive traces 209. The packaging adhesive 212 may prevent the light emitting diode chips 206 from damage. Also, the packaging adhesive 212 may allow output of light emitted from the light emitting diode chips 206. In one embodiment, the packaging adhesive 212 may comprise material such as silicon, epoxy, fluorescent glue or combinations thereof.

FIGS. 1b and 1c are top views of other exemplary embodiments of light emitting diodes 500a and 500b of the invention showing various electrical connections of the light emitting chips 206a. As shown in FIG. 1b, the light emitting diode chip 206a has a p-type electrode and an n-type electrode (not shown) both on the top surface of the light emitting diode chip 206a. The p-type electrode and the n-type electrode are respectively and electrically connected to the first conductive trace metal layer 208a and the second conductive trace metal layer 208b through the conductive traces 209. Therefore, the light emitting diode chips 206a are connected in series. It is noted that in alternative embodiments as shown in FIG. 1c, the light emitting diode chips 206a are respectively and electrically connected to the first conductive trace metal layer 208a and the second conductive trace metal layer 208b through the conductive traces 209. Therefore, the light emitting diode chips 206a are connected in parallel. As shown in FIGS. 1b, 1c, 1d and 1e, the conductive trace structure of the light emitting diodes 500a and 500b may comprise a first conductive trace metal layer 208a and a second conductive trace metal layer 208b directly disposed on the first surface 202 of the ceramic substrate 200, a third conductive trace metal layer 208c disposed between the ceramic substrate 200 and the light emitting diode chips 206, electrically connecting to the light emitting diode chips 206a, conductive traces 209 electrically connected between the light emitting diode chips 206a and the second conductive trace metal layer 208b or third conductive trace metal layer 208c, and fourth and fifth conductive trace metal layers 208d and 208e disposed on the second surface 204 of the ceramic substrate 200.

As shown in FIGS. 1d and 1e, one exemplary embodiment of a light emitting diode 500 further comprises a plurality of thermal metal pads 216 disposed on the second surface 204 of the ceramic substrate 200. The thermal metal pads 216 may dissipate heat generated from the light emitting diode chips 206 to the outside atmosphere. In one embodiment, surfaces of the thermal metal pads 216 away from the ceramic substrate 200 and surfaces of the fourth and fifth conductive trace metal layers 208d and 208e are coplanar, thereby ensuring the fourth and fifth conductive trace metal layers 208d and 208e and the thermal metal pads 216 to have good electrical connections with the circuit substrate 222 connected to the second surface 204 of the ceramic substrate 200. A plurality of the thermal metal pads 216 are electrically isolated from each other at a distance d. Additionally, the thermal metal pads 216 are electrically isolated from the light emitting diode chips 206, the fourth and fifth conductive trace metal layers 208d and 208e.

As shown in FIG. 1e, in one exemplary embodiment of a light emitting diode 500, the fourth and fifth conductive trace metal layers 208d and 208e disposed on the second surface 204 of the ceramic substrate 200 and the thermal metal pads 216 are bonded to the circuit substrate 222 through solders by soldering. For example, the fourth conductive trace metal layer 208d may connect to the bonding pad 224a of the circuit substrate 222 by a solder 228a. The fifth conductive trace metal layer 208e may connect to the bonding pad 224b of the circuit substrate 222 by a solder 228b. The bonding pads 224a and 224b are used to transmit input/output (I/O) signals, ground signals, and power signals of the light emitting diode chips 206. Additionally, the thermal metal pads 216 may connect to a plurality of bonding pads 226 of the circuit substrate 222 by solders 228c. Therefore, the bonding pads 226 may dissipate heat generated from the light emitting diode chips 206 to the outside atmosphere through the circuit substrate 222. In one embodiment, the bonding pads 226 connecting to the thermal metal pads 216 may have the same size and number with the thermal metal pads 216. Alternatively, the thermal metal pads 216 may also be bonded to a single bonding pad having a larger area (not shown).

One embodiment of the light emitting diode 500 having a plurality of the thermal metal pads 216 isolated from each other has the advantages as follows. The thermal metal pads 216 disposed on the ceramic substrate 200 are numerous, having smaller bonding areas. Despite unevenness of the ceramic substrate 200, each solder can firmly adhere to corresponding thermal metal pads 216. Therefore, reducing the gas hole generation problem. If a gas hole is generated at an interface between one of the thermal metal pads 216 and the circuit substrate 222 due to poor bonding, gas is immediately exhausted to the outside atmosphere. Therefore, reliability of the light emitting diode is not seriously affected. Also, if a crack occurs in one of the thermal metal pads 216 due to poor bonding, the generated crack would be prevented from worsening, due to the spacing d between the thermal metal pads 216. Therefore, the generated crack would be limited to the thermal metal pad 216 without affecting adjacent thermal metal pads. The spacing between the thermal metal pads 216 may serve to limit probability of detachment due to poor bonding of one thermal metal pad 216. For example, if one of the thermal metal pads 216 detaches from the circuit substrate 222 at an interface between the thermal metal pads 216 and the circuit substrate 222, bonding of adjacent thermal metal pads 216 and the circuit substrate 222 would not be seriously affected. Therefore, electrical performance, reliability and heat dissipating efficiency of the light emitting diode 500 are maintained, despite the detachment due to poor bonding of one thermal metal pad.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light emitting diode, comprising:
   a ceramic substrate having a first surface and an opposite second surface;
   a first conductive trace metal layer and a second conductive trace metal layer disposed on the first surface of the ceramic substrate, respectively;
   at least one light emitting diode chip disposed on the first surface of the ceramic substrate, respectively and electrically connected to the first and second conductive trace metal layers; and
   a plurality of thermal metal pads disposed on the second surface of the ceramic substrate, wherein the thermal metal pads are electrically isolated from the light emitting diode chip.

2. The light emitting diode as claimed in claim 1, further comprising a third conductive trace metal layer disposed on the first surface of the ceramic substrate, the light emitting diode chip disposed on the third conductive trace metal layer, electrically connected to the first conductive trace metal layer through the third conductive trace metal layer, and the light emitting diode chip, electrically connected to the second conductive trace metal layer.

3. The light emitting diode as claimed in claim 1, further comprising a conductive trace electrically connected to the light emitting diode chip and the second conductive trace metal layer.

4. The light emitting diode as claimed in claim 2, further comprising a conductive trace electrically connected to the light emitting diode chip and the second conductive trace metal layer.

5. The light emitting diode as claimed in claim 2, further comprising a conductive trace electrically connected to the third conductive trace metal layer and the first conductive trace metal layer.

6. The light emitting diode as claimed in claim 1, wherein surfaces of the thermal metal pads away from the ceramic substrate are coplanar.

7. The light emitting diode as claimed in claim 1, wherein the thermal metal pads are electrically isolated from each other.

8. The light emitting diode as claimed in claim 1, further comprising a fourth conductive trace metal layer and a fifth conductive trace metal layer disposed on the second surface of the ceramic substrate, wherein the first and second conductive trace metal layers are respectively and electrically connected to the fourth and fifth conductive trace metal layers through vias in the ceramic substrate.

9. The light emitting diode as claimed in claim 1, further comprising a packaging adhesive encapsulating the first surface of the ceramic substrate and the light emitting diode chip.

10. The light emitting diode as claimed in claim 1, wherein the ceramic substrate comprises aluminum nitride (AlN) or aluminum oxide ($Al_2O_3$).

11. The light emitting diode as claimed in claim 1, wherein the thermal metal pads comprises Ag, Cu, Ni, Al or combinations thereof.

12. The light emitting diode as claimed in claim 1, wherein the conductive trace metal layer comprises Ag, Cu, Ni, Al or combinations thereof.

13. The light emitting diode as claimed in claim 1, wherein the packaging adhesive comprises silicon, epoxy, fluorescent glue or combinations thereof.

14. The light emitting diode as claimed in claim 1, wherein the thermal metal pads are respectively and electrically connected to a plurality of bonding pads disposed on a circuit substrate.

15. The light emitting diode as claimed in claim 1, wherein the thermal metal pads are respectively and electrically connected to a single bonding pad disposed on a circuit substrate.

* * * * *